United States Patent
Chiang et al.

(10) Patent No.: US 6,383,863 B1
(45) Date of Patent: May 7, 2002

(54) APPROACH TO INTEGRATE SALICIDE GATE FOR EMBEDDED DRAM DEVICES

(75) Inventors: Min-Hsiung Chiang, Taipei; Hsiao-Hui Tseng, Tainan; Hsien-Yuan Chang, Taipei; Chung-Wei Chang; Kuo-Chyuan Tzeng, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/963,595

(22) Filed: Sep. 27, 2001

(51) Int. Cl.[7] ............................................. H01L 21/8242
(52) U.S. Cl. ...................... 438/241; 438/255; 438/673
(58) Field of Search ................................ 438/210, 241, 438/253, 255, 396, 398, 637, 672, 673 978

(56) References Cited

U.S. PATENT DOCUMENTS

| | | | |
|---|---|---|---|
| 5,858,831 A | * 1/1999 | Sung | 438/241 |
| 5,879,986 A | * 3/1999 | Sung | 438/672 |
| 5,930,618 A | 7/1999 | Sun et al. | 438/240 |
| 6,074,915 A | 6/2000 | Chen et al. | 438/258 |
| 6,096,595 A | 8/2000 | Huang | 438/238 |
| 6,150,214 A | 11/2000 | Kaeriyama | 438/253 |
| 6,291,335 B1 | * 9/2001 | Schnabel et al. | 438/241 |

* cited by examiner

*Primary Examiner*—Chandra Chaudhari
(74) *Attorney, Agent, or Firm*—George O. Saile; Stephen B. Ackerman

(57) ABSTRACT

A process for integrating the formation of a salicide layer on DRAM word line structures, and on a bit line contact structure, has been developed. The process features selective etch back of the insulator layers embedding the tapered shaped bit line contact, and the tapered shape capacitor structures, exposing top surface portions of polysilicon word line structures. The selective etch back procedure also results in formation of insulator spacers on the sides of the tapered bit line contact, and capacitor structures, allowing a subsequent salicide procedure to form metal suicide layers only on the exposed top surfaces of the DRAM word line, bit line contact, and capacitor structures.

22 Claims, 6 Drawing Sheets

APPROACH TO INTEGRATE SALICIDE GATE FOR EMBEDDED DRAM DEVICES

BACKGROUND OF THE INVENTION

(1) Field of the Invention

The present invention relates to methods used to fabricate semiconductor devices, and more specifically to a process used to form salicide layers on components of an embedded, dynamic random access memory, (DRAM), device.

(2) Description of Prior Art

The performance of DRAM cells, embedded in logic arrays, can be deleteriously influenced by the high resistance of the DRAM word lines. The desired objective of low resistance for narrow width, DRAM word lines, can be difficult to satisfy via use of polycide word lines, comprised of an overlying metal silicide layer, such as tungsten silicide, on an underlying polysilicon shape. The higher. than desired resistance of the tungsten silicide component may require metal strapping to reduce the resistance—capacitance (RC), delay, since the memory cell, in the DRAM circuit, is accessed through the word line structure. The need for metal strapping to increase performance results in additional process complexity and increased cost.

This invention will describe a process in which a self-aligned silicide (salicide), formation procedure, easily integratable with logic devices, is used to reduce the resistance of the DRAM word line structures, without the use of metal strapping. In addition this invention will teach the process for integrating a salicide formed, cobalt silicide layer on the DRAM word line, as well as on the crown shaped capacitor structure, while preventing formation of the cobalt suicide layer on the shallow DRAM source/drain regions. The use of self-aligned contact (SAC) openings for capacitor and bit line openings, in addition to the formation of insulator spacers on the sides of the structures in these openings, allow sufficient space to accommodate a salicided word line contact structure, a capacitor structure, and a bit line structure, without increasing the DRAM cell size. Prior art, such as Sun et al, in U.S. Pat. No. 5,930,618, describe a process for integrating logic and DRAM memory, however that prior art uses; the higher resistance polycide gate for the DRAM device, while the lower resistance salicide gates are used only for logic devices.

SUMMARY OF THE INVENTION

It is an object of this invention to reduce the resistance of the word line structures in embedded DRAM devices, via the use of salicide procedures.

It is another object of this invention to minimize DRAM cell size via a self-aligned procedure used to form salicide layers on the DRAM word line structures, while not forming salicide layers on the DRAM source/drain regions.

It is still another object of this invention to form cobalt silicide on the top surfaces of capacitor and bit line structures, of a capacitor under bit line design, while simultaneously forming cobalt silicide layers on the DRAM word line structures.

In accordance with the present invention a process for self-aligning the formation of a salicide layer on embedded DRAM, word lines, capacitor, and bit line structures, while preventing salicide formation on the embedded DRAM source/drain region, is described. After formation of source/drain regions, in regions of semiconductor substrate not covered by silicon nitride capped, polysilicon gate structures, a planarized composite insulator layer is formed. Capacitor and bit line openings are formed in the planarized, first composite insulator layer, with the bottom portion of these openings self-aligned to the silicon nitride capped, polysilicon gate structures. The capacitor and bit line openings are then lined with storage node structures and an capacitor dielectric layer, then filled with a top plate component. A selective etch is then employed to anisotropically remove the planarized, first composite insulator layer, as well to remove the capping insulator components of the silicon nitride capped, polysilicon gate structures, exposing the top surfaces of the polysilicon gate structures. The same selective etch procedure simultaneously defines an insulator spacer on the sides of the capacitor and bit line structures, resulting in self-alignment between the capacitor and bit line structures, lined with the insulator spacers, and the adjacent, uncapped, polysilicon gate structures. The source/drain regions remain unexposed, underlying the capacitor and bit line structures. A salicide formation procedure is next used to form a cobalt silicide layer on the exposed top surface of the uncapped, polysilicon gate structures, as well as on the top surface of the capacitor and bit line structures, with the insulator spacers located on the sides of the capacitor and bit line structures preventing shorting between these salicided components. After formation of a planarized, second composite insulator layer, openings are formed in this composite insulator layer exposing top portions of a salicided word line structure, and a top portions of the salicided bit line structure. Conductive plug and metal structures are then formed in these openings, contacting the word line structure, as well as the bit line structure, of the capacitor under bit line, embedded DRAM cell.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
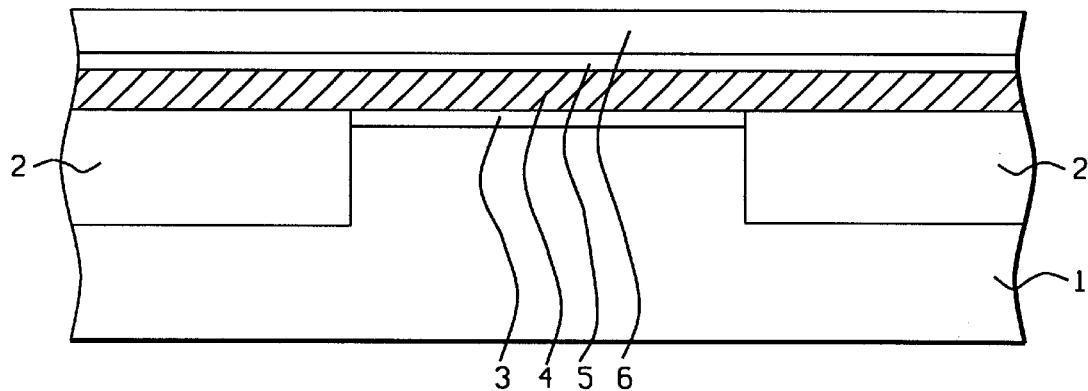
FIGS. 1–11, which schematically, in cross-sectional style, describe key stages of fabrication used to reduce the resistance of an embedded DRAM word line structure via the use of a self-aligned, salicide formation procedure.

The method of forming self-aligned salicide layers on an embedded DRAM word line, capacitor and bit line structures, featuring the formation of insulator spacers on the sides of the capacitor and bit line structures allowing the self-aligned salicide procedure to be realized, will now be described in detail. Semiconductor substrate 1, comprised of P type, single crystalline silicon, featuring a <100> crystallographic orientation, is used and schematically shown in FIG. 1. Insulator filled, shallow trench regions 2, are used for isolation purposes. The shallow trench isolation regions are first defined via photolithographic and anisotropic, reactive ion etching (RIE), procedures, using $Cl_2$ of $SF_6$ as an etchant to form the shallow trenches to a depth between about 2500 to 5500 Angstroms in semiconductor substrate 1. After removal of the shallow trench defining photoresist shape, (not shown in the drawings, a silicon oxide layer is deposited via low pressure chemical vapor deposition (LPCVD), or plasma enhanced vapor deposition (PECVD), procedures, to a thickness between about 5000 to 8000 Angstroms, completely filling the shallow trench shapes. A chemical mechanical polishing (CMP), procedure is then employed to remove portions of the trench filling silicon oxide layer located on the semiconductor substrate surface, resulting in STI regions 2. If desired the isolation regions can be obtained via localized oxidation of silicon (LOCOS). Silicon dioxide gate insulator layer 3, is next thermally grown to a thickness between about 10 to 100 Angstroms, followed by the deposition of polysilicon layer 4, accomplished via LPCVD procedures at a thickness between about 1000 to 3000 Angstroms. Polysilicon layer 4, can be doped in situ, during deposition, via the addition of arsine, or phosphine, to a silane ambient, or polysilicon layer 4, can be deposited intrinsically then doped via implantation of arsenic or phosphorous ions. Silicon oxide layer 5, is next deposited to a thickness between about 100 to 1000 Angstroms, via,t LPCVD or PECVI) procedures, using tetraethylorthosilicate (TEOS), as a source, followed by the deposition of silicon nitride layer 6, at a thickness between about 500 to 2000 Angstroms, again via LPCVD or PECVD procedures. The result of these process steps is schematically shown in FIG. 1.

Figure 2:
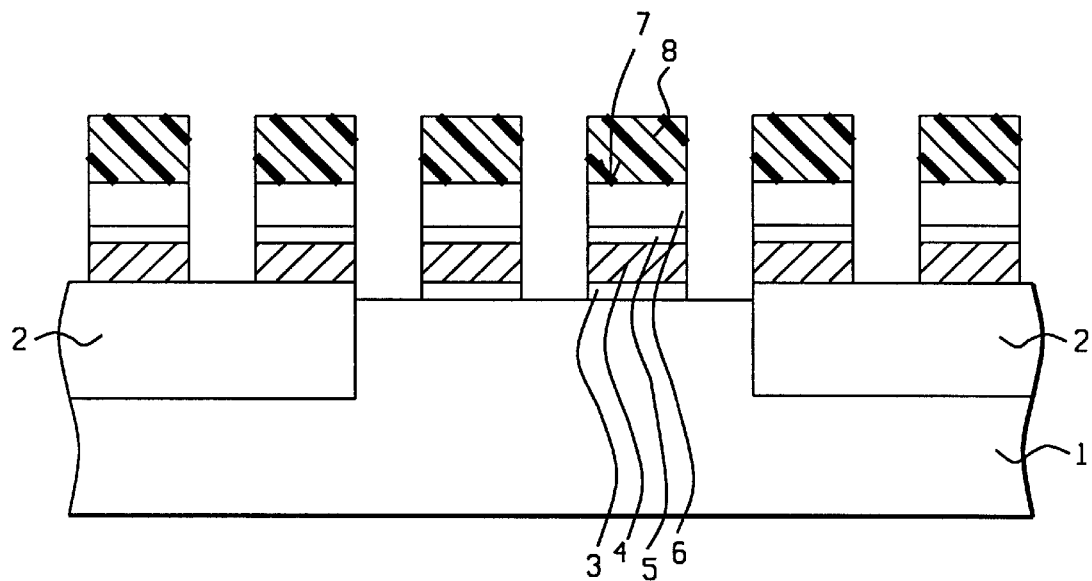

Photoresist shape 8, is next used as a mask to allow an anisotropic RIE procedure to define silicon nitride capped gate structures 7, schematically shown in FIG. 2. The anisotropic RIE procedure is performed using $Cl_2$ or $CF_4$ as an etchant for silicon nitride layer 6, $CHF_3$ as an etchant for silicon oxide layer 5, and $Cl_2$ or $SF_6$ as an etchant for polysilicon layer 4. Removal of photoresist shape 8, is performed using plasma oxygen ashing techniques and careful wet cleans. The wet clean procedures result in removal of the portions of silicon dioxide gate insulator layer 3, not covered by silicon nitride capped gate structures 7.

Figure 3:
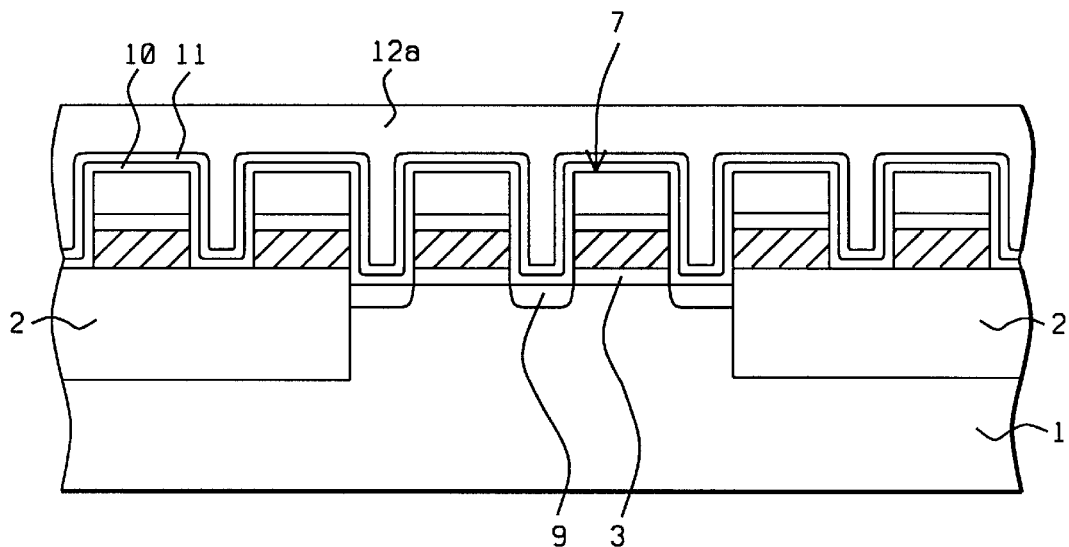

Source/drain regions 9, are next formed in regions of semiconductor substrate 1, not covered by silicon nitride capped gate structures 7, via implantation of arsenic or phosphorous ions, at an energy between about 15 to 90 KeV, at a (lose between about 1E12 to 5E13 atoms/$cm^2$. Silicon oxide layer 10, is deposited via LPCVD or PECVD procedures, to a thickness between about 100 to 300 Angstroms, using TEOS as a source, followed by deposition of silicon nitride layer 11, at a thickness between about 200 to 500 Angstroms, via LPCVD or PECVD procedures. Boro-phosphosilicate glass (BPSG), layer 12a, is then deposited via PECVD procedures, to a thickness between about 5000 to 10000 Angstroms, using TEOS as a source for the silicon oxide component of BPSG layer 12a. A CMP procedure is then employed for planarization purposes resulting in a smooth top surface topography for BPSG layer 12a. This is schematically shown in FIG. 3.

Figure 4:
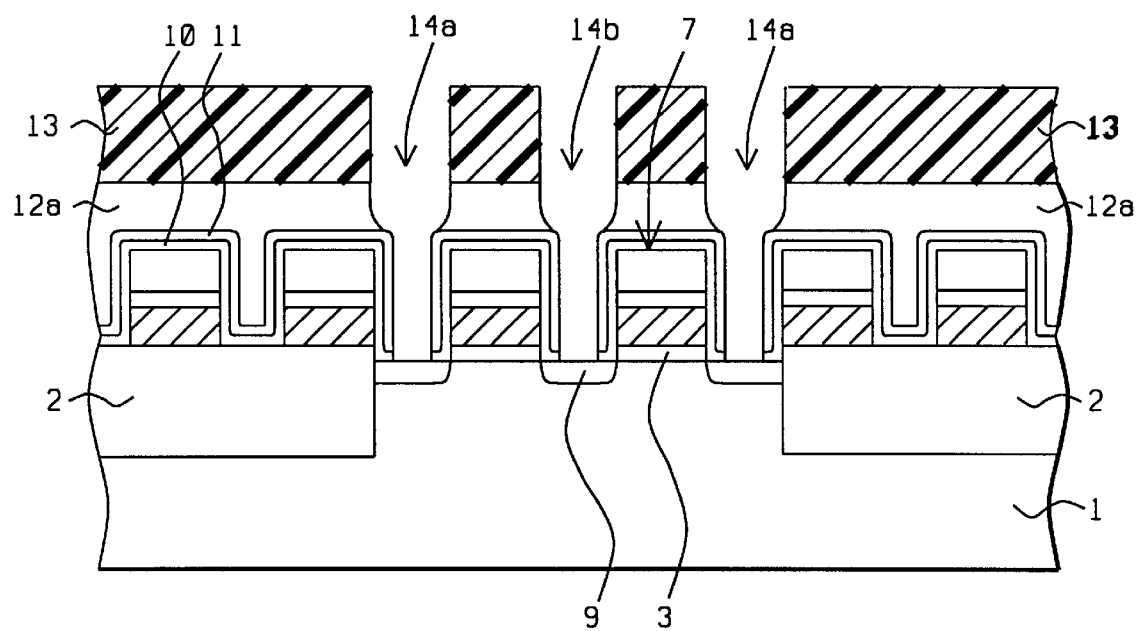

Capacitor and bit line openings, exposing portions of the top surface of source/drain regions 9, are next addressed and schematically described in FIG. 4. Photoresist shape 13, is used as an etch mask allowing an isotropic dry etch procedure to define capacitor openings 14a, and bit line opening 14b, in BPSG layer 12a, in silicon nitride layer 11, and in silicon oxide layer 10. The openings in BPSG layer 12a, are performed using a. RIE procedure at a pressure between about 30 to 60 mtorr. This pressure range allows an isotropic component of the dry etch procedure to taper the top portion of the openings to subsequently allow insulator spacers to be formed on the outside surfaces of structures that will be located in these openings. Selective etching of BPSG layer 12a, is accomplished using $CHF_3$ as an etchant, and with the appearance of silicon nitride layer 11, the procedure is continued, in an anisotropic mode, at a pressure between about 40 to 60 mtorr, using $Cl_2$ as an etchant for silicon nitride layer 11, then using $CHF_3$ as a selective etchant for silicon oxide layer 10. Capacitor openings 14a, as well as bit line opening 14b, are self aligned to silicon nitride capped gate structures 7. Photoresist shape 13, is then removed via plasma oxygen ashing procedures.

Figure 5:
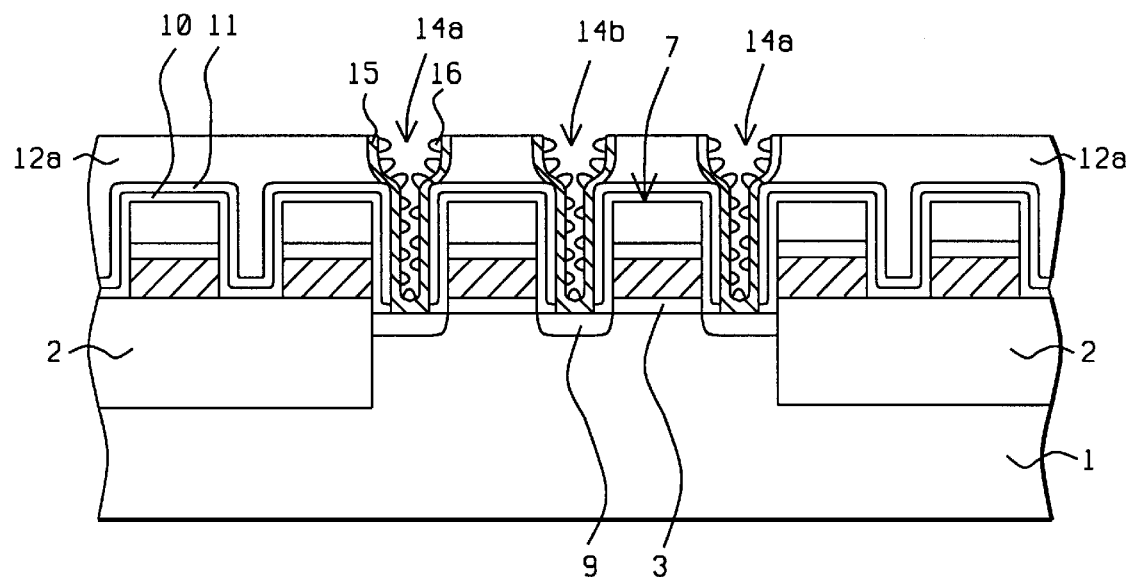
Figure 6:
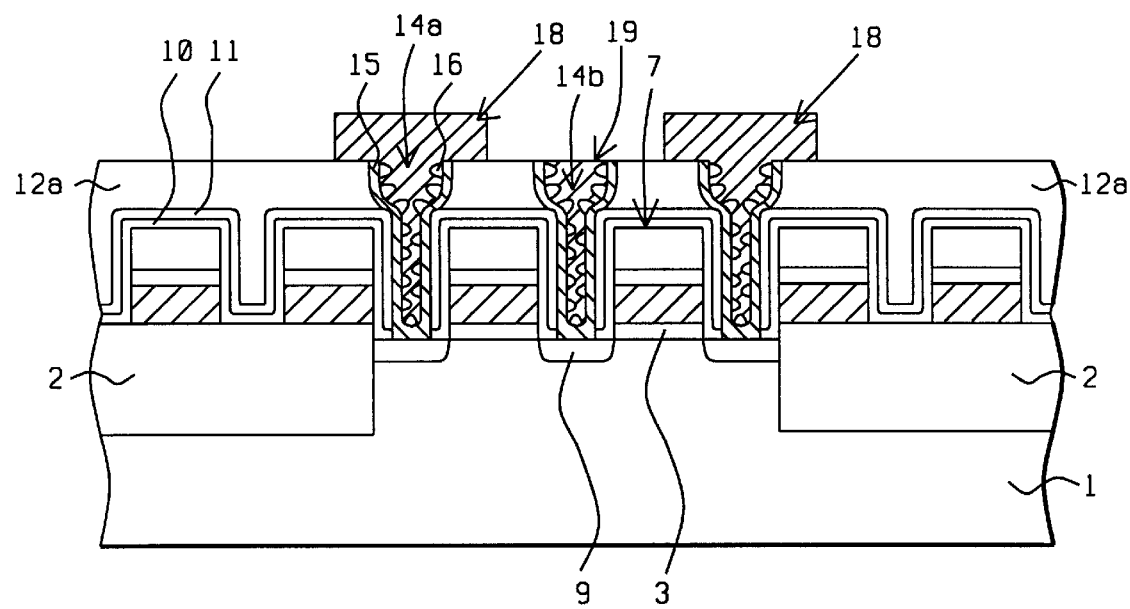

Formation of the capacitor and bit line structures are next addressed and schematically shown using FIGS. 5–6. A polysilicon or amorphous silicon layer 15, is deposited via LPCVD procedures, at a thickness between about 2000 to 4000 Angstroms. The polysilicon or amorphous silicon layer is doped in situ, during deposition, via the addition of arsine, or phosphine, to a silane ambient. An anneal procedure is next performed at a temperature between about 500 to 600° C., at a pressure between about 10 to 100 mtorr, to grow hemispherical grain (HSG), silicon layer 16, on the top surface of polysilicon or amorphous silicon layer 15. The HSG silicon layer will increase the surface area of the storage node structure of a subsequent capacitor structure thus allowing increased capacitance to be realized. A CMP procedure is then employed to remove portions of HSG layer 16, and polysilicon layer 15, from the top surface of BPSG layer 12a, resulting in the definition of storage node structures in capacitor openings 14a. This is schematically shown in FIG. 5. A capacitor dielectric layer, not shown in the drawings, is next formed on the surface of HSG silicon layer 16. The capacitor dielectric layer, at a thickness between about 30 to 90 Angstroms, can be comprised of oxidized silicon nitride (NO), or oxidized silicon nitride on silicon oxide (ONO). Another polysilicon layer is then deposited via LPCVD procedures, at a thickness between about 500 to 1000 Angstroms, completely filling capacitor openings 14a, and bit line opening 14b. The polysilicon layer is doped in situ, during deposition, via the addition of arsine, or phosphine, to a silane ambient. A photoresist shape, not shown in the drawings is formed and used as an etch mask to allow a selective, anisotropic RIE procedure, using $Cl_2$ or $SF_6$ as an etchant for polysilicon, to define capacitor top plate structures 16, in capacitor openings 14a, and bit line contact structure 19, in bit line opening 14b. Capacitor structures 18, are defined with portions of polysilicon top plate structures 16, overlaying portions of the top surface of BPSG layer 12a. The result of the deposition and patterning procedures, is schematically shown in FIG. 6.

Figure 7:
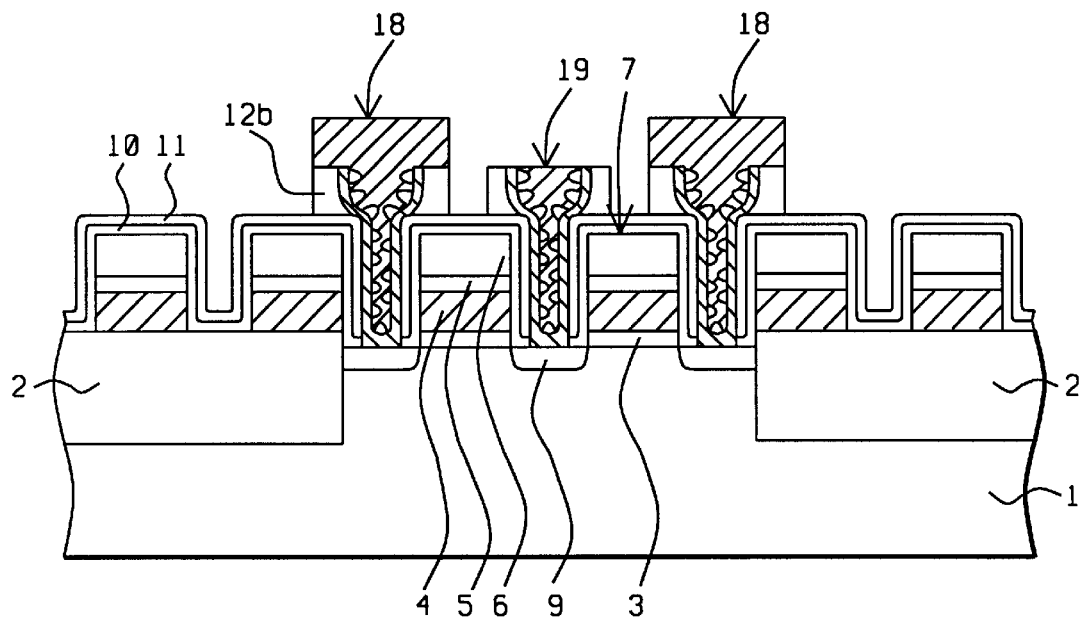
Figure 8:
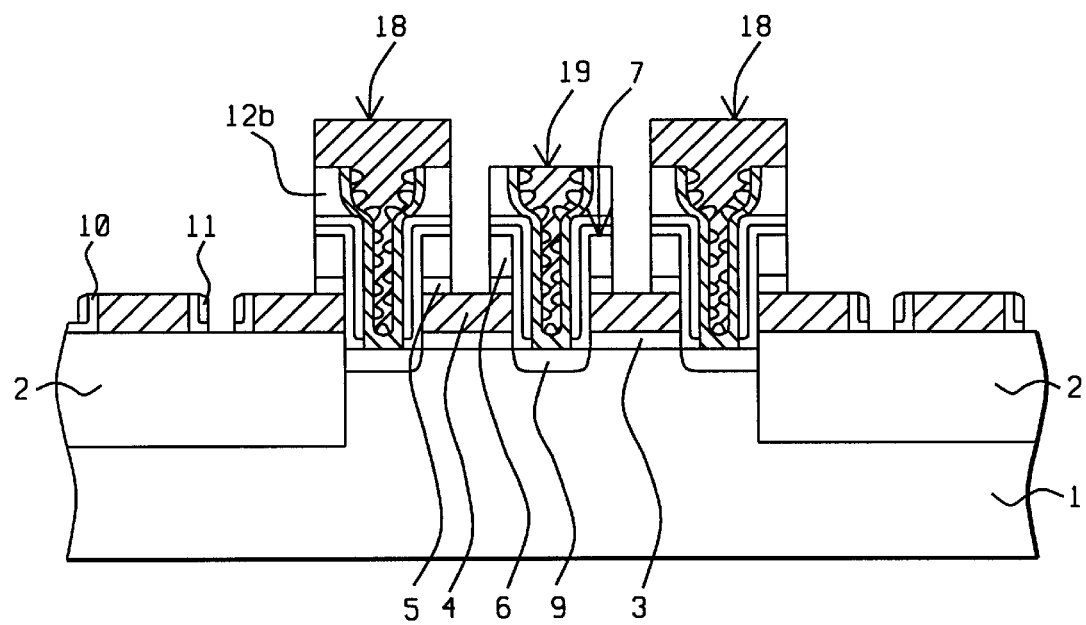

The critical procedures used to expose portions of top surface of the silicon nitride capped gate structures, and to self-align the salicide formation of these exposed structures is next addressed. A blanket RIE procedure using $CHF_3$ as an etchant, is used to anisotropically, and selectively remove exposed regions of BPSG layer 12a, with the selective RIE procedure terminating at the appearance of the top surface of silicon nitride capped gate structures 7. The anisotropic component of this RIE procedure alloyed BPSG spacers 12b, to be formed on the sides of capacitor structures 18, and on the sides of bit line contact structure 19. The overhang of the top plate structure, and the tapered profile of these structures allowed the desired BPSG spacers to be formed. This is schematically shown in FIG. 7. The blanket, anisotropic RIE procedure is then continued using $Cl_2$ or $CF_4$ as an etchant for silicon nitride layer 11, $CHF_3$ as an etchant for silicon oxide layer 10, then again using $Cl_2$ or $CF_4$ as an etchant for silicon nitride layer 6. Finally $CHF_3$ is selectively used to remove exposed portions of silicon oxide layer 5, with the selective RIE procedure terminating at the appearance of polysilicon layer 4. This is schematically shown in FIG. 8.

Figure 9:
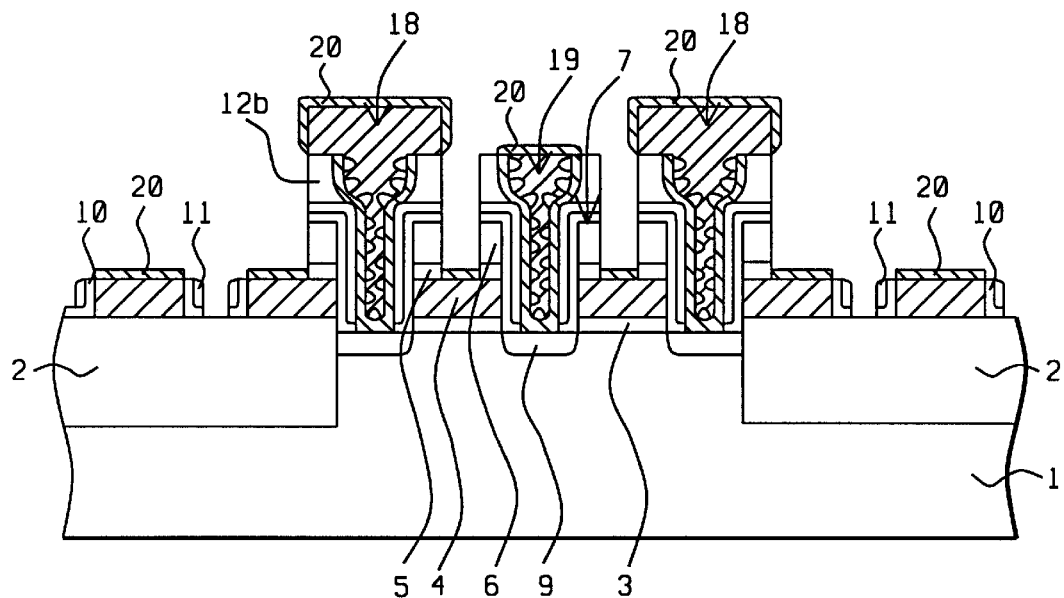

The ability to expose the polysilicon component of the silicon nitride capped gate, or word line structures, and to isolate the capacitor and bit line contact structures from the word line structures, allow self-aligned, low resistively, salicide regions to be formed on the word line structures. A metal layer, such as cobalt, is deposited via plasma vapor deposition procedures, at thickness between about 100 to 300 Angstroms. If desired other metal layers such as titanium or nickel, can be used. An anneal procedure, performed in a conventional furnace, or in a rapid thermal anneal furnace, is used to form cobalt silicide ($CoSi_x$), layer 20, on regions in which cobalt overlayed either the polysilicon layer 4, of the word line structures, or polysilicon exposed in capacitor structures 18, or in bit line contact structure 19. The anneal procedure is performed at a temperature between about 500 to 800° C., for a time between about 30 to 60 sec. Regions of cobalt overlaying non-silicon surfaces, such as BPSG spacers 12b, remain unreacted, and are selectively removed via use of a solution of $H_2O_2$—$H_2SO_4$—HCl—$NHOH_4$, at a temperature between about 50 to 100° C. The low sheet resistance of cobalt silicide, less than 5 ohms/square, allows sufficient conductivity for word line structures, thus eliminating the need for metal strapping procedures which are used with designs incorporating higher resistance word line structures. In addition the avoidance of silicide formation of the DRAM cell source/drain regions 9, protected by the capacitor and bit line contact structures, minimized leakage. The result of the salicide formation procedure, featuring low resistivity cobalt silicide layer 20, is schematically shown in FIG. 9.

Figure 10:
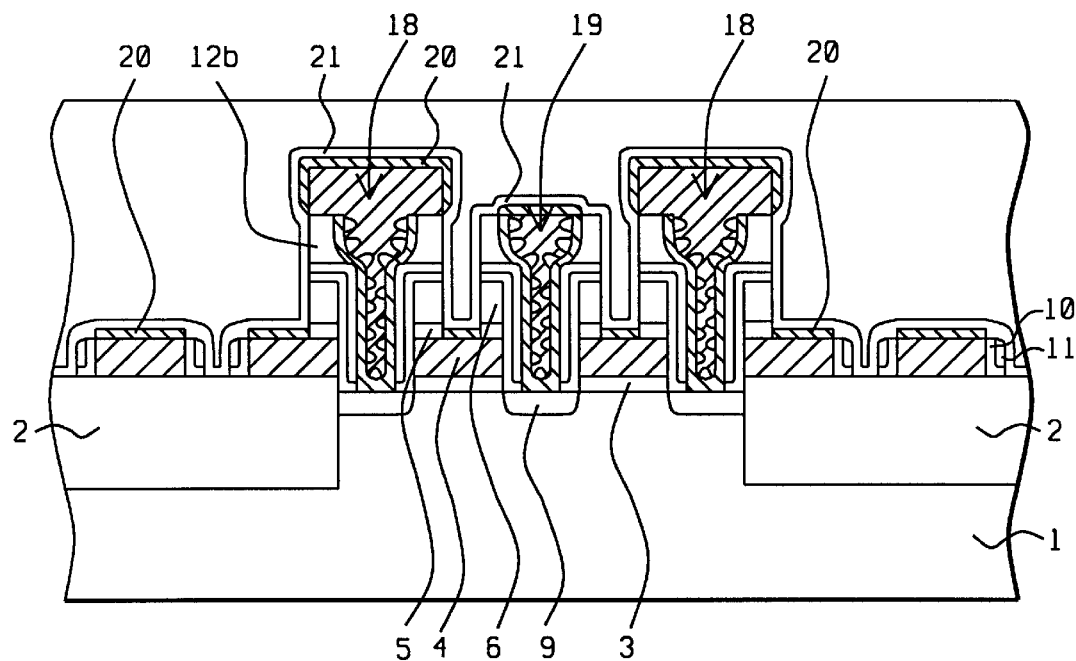
Figure 11:
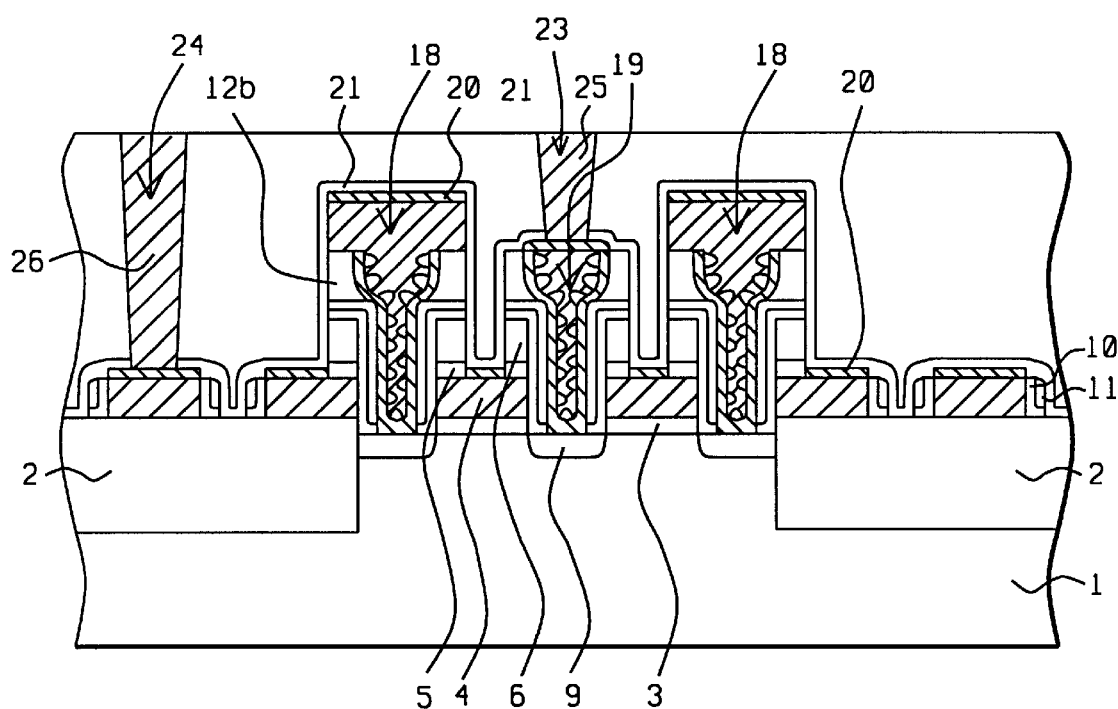

Deposition of silicon oxynitride liner 21, at a thickness between about 200 to 500 Angstroms, is next performed via PECVD or LPCVD procedures, followed by the deposition of either BPSG or silicon oxide layer 22, it a thickness between about 5000 to 15000 Angstroms, again via PECVD procedures. Planarization of insulator layer 22, is then accomplished via CMP procedures. The result of these process steps is schematically shown in FIG. 10. A photoresist shape, not shown in the drawings, is next used as an etch mask to allow a RIE procedure, using $CHF_3$ as an etchant for insulator layer 22, and $CF_4$ as an etchant for silicon oxynitride layer 21, to define opening 23, exposing the top surface of a cobalt silicide layer located on bit line contact structure 19, and to define opening 24, exposing the top surface of a cobalt silicide layer located on a polysilicon component of a word line structure. After removal of the photoresist shape used to define these openings, a tungsten layer is deposited, via LPCVD procedures to a thickness between about 2000 to 5000 Angstroms, completely filling opening 23, and opening 24. Unwanted portions of tungsten, located on the top surface of insulator layer 22, are then removed via CMP procedures, or via a selective RIE procedure using $Cl_2$ or $SF_6$ as an etchant for tungsten, resulting in the definition of tungsten plug structure 25, in opening 23, overlying and contacting bit line contact structure 19, and tungsten plug structure 26, overlying and contacting a salicided, DRAM word line structure, in opening 24. This is schematically shown in FIG. 11. Metal wiring procedures, not described in this invention, are then used to communicate with the underlying components of the DRAM cell.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a dynamic random access memory (DRAM), device, on a semiconductor substrate, comprising the steps of:

providing insulator capped gate structures on an underlying gate insulator layer, with source/drain regions located in portions of said semiconductor substrate not covered by said insulator capped gate structures;

forming a planarized first composite insulator layer;

forming a capacitor opening and a bit line contact opening in said planarized first composite insulator layer, with said capacitor opening, and said bit line contact opening, self-aligned to said insulator capped gate structures, and exposing top portions of said source/drain regions;

forming a capacitor structure in said capacitor opening, and a bit line contact structure in said bit line contact opening;

removing a top insulator layer component of said planarized first composite insulator layer, forming insulator spacers from said top insulator layer component on the sides of a top portion of said capacitor structure and of on the sides of a top portion of said bit line contact structure;

removing exposed portions of capping insulator layers from portions of said insulator capped gate structures, exposing conductive gate layer component of said insulator capped gate structures, exposed between said capacitor structure and said bit line contact structure;

forming a metal silicide layer on exposed portions of said conductive gate layer, and to form a metal silicide layer on top surface of said capacitor structure and on top surface of said bit line contact structure;

forming a second planarized composite insulator layer;

forming a first opening in said planarized second composite insulator layer exposing a portion of a metal silicide layer overlying said conductive gate layer component, and forming a second opening in said planarized second composite insulator layer exposing a portion of a metal silicide layer located overlying said bit line contact structure; and forming metal plug structures in said first opening, and in said second opening in said planarized second composite insulator layer.

2. A method of claim 1, wherein said conductive gate layer of said insulator capped gate structures, is a polysilicon layer, obtained via LPCVD procedures at a thickness between about 1000 to 3000 Angstroms, and doped in situ, during deposition via the addition of arsine, or phosphine, to a silane ambient.

3. The method of claim 1, wherein said planarized first composite insulator layer is comprised of: an underlying layer of silicon oxide, obtained via LPCVD or PECVD procedures at a thickness between about 100 to 300 Angstroms; a silicon nitride layer, obtained via LPCVD or PECVD procedures at a thickness between about 200 to 500 Angstroms; and an overlying boro-phosphosilicate glass (BPSG) layer, obtained via PECVD procedures to a thickness between about 5000 to 10000 Angstroms.

4. The method of claim 1, wherein said capacitor opening, and said bit line contact opening, are defined in said planarized first composite insulator layer via a RIE procedure, using $CHF_3$ as an etchant for the BPSG component of the planarized first composite insulator layer, performed at a pressure between about 30 to 60 mtorr, while using $Cl_2$ as an etchant for silicon nitride, and using $CHF_3$ as an etchant for silicon oxide, at a pressure between about 40 to 60 mtorr.

5. The method of claim 1, wherein said capacitor structure is comprised: of a storage node structure, in turn comprised of an underlying polysilicon or amorphous silicon layer, and an overlying hemispherical grain (HSG), silicon layer; a capacitor dielectric layer comprised of either oxidized silicon nitride (NO), or oxidized silicon nitride on silicon oxide (ONO); and an overlying top plate structure comprised of an in situ doped polysilicon layer.

6. The method of claim 1, wherein said top insulator layer of said planarized first composite insulator layer, a BPSG layer, is selectively removed via said first cycle of anisotropic RIE procedure, using $CHF_3$ as an etchant.

7. The method of claim 1, wherein said insulator spacers, formed on the sides of said capacitor structure and on the sides of said bit line structure, during a first cycle of anisotropic RIE procedure, are comprised of BPSG.

8. The method of claim 1, wherein a second cycle of said anisotropic RIE procedure, used to expose said conductive gate layer component of said insulator capped gate structures, is performed using $CF_4$ or $Cl_2$ as an etchant for silicon nitride layers, while $CHF_3$ is used as an etchant for silicon oxide layers.

9. The method of claim 1, wherein said metal silicide layer is a cobalt silicide layer, formed from an anneal procedure applied to a cobalt layer in regions in which the cobalt layer overlayed exposed silicon portions of word line, bit line contact, and capacitor structures, with the cobalt layer was obtained via plasma vapor deposition procedures at a thickness between about 100 to 300 Angstroms, and wherein the anneal procedure was performed at a temperature between about 500 to 800° C., for a time between about 30 to 60 sec.

10. The method of claim 1, wherein said planarized second composite insulator layer is comprised of: an underlying silicon oxynitride layer, obtained via PECVD or LPCVD procedures at a thickness between about 200 to 500 Angstroms; and comprised of an overlying BPSG layer, obtained via PECVD procedures at a thickness between about 5000 to 15000 Angstroms.

11. The method of claim 1, wherein said metal plug structures are tungsten plug structures, defined via a CMP procedure applied to a tungsten layer which in turn was obtained from via LPCVD procedures at a thickness between about 2000 to 6000 Angstroms.

12. A method of fabricating a DRAM device on a semiconductor substrate, featuring salicide formation on DRAM word line structures, with salicide regions self aligned to capacitor and bit line structures, and with the capacitor and bit line structures lined with sidewall spacers, comprising the step of providing silicon nitride capped polysilicon gate structures on an underlying silicon dioxide gate insulator layer, with source/drain regions located in portions of said semiconductor substrate not covered by said silicon nitride capped polysilicon gate structures;

depositing a silicon-oxide layer;

depositing a silicon nitride layer;

depositing a first boro-phosphosilicate g,lass (BPSG), layer;

performing a first chemical mechanical polishing (CMP), procedure to planarize said first BPSG layer;

performing a first dry etching procedure to form a tapered capacitor opening, and a tapered bit line contact opening, in said first BPSG layer, in said silicon nitride layer, and in said silicon oxide layer, and with a bottom portion of said tapered capacitor opening, and said tapered bit line contact opening, self-aligned to said silicon nitride capped polysilicon gate structures, exposing top portions of said source/drain regions;

forming a capacitor structure in said tapered capacitor opening, and a bit line structure in said tapered bit line contact opening, with said capacitor structure comprised of a storage node structure which in turn is comprised of an underlying polysilicon layer and an overlying hemispherical grain (HSG), silicon layer, and with said capacitor structure also comprised with a capacitor dielectric layer, formed on said storage node structure, and also comprised with an overlying polysilicon top plate structure;

performing a first cycle of a second dry etch procedure to selectively, and anisotropically, remove said first BPSG layer from the top surface of said silicon nitride layer, resulting in the formation of BPSG spacers located on the sides of top portions of said capacitor structure and of said bit line contact structure;

performing a second cycle of said second dry etch procedure to remove exposed portions of said silicon nitride layer, and exposed portions of said silicon oxide layer, exposing top surface portions of polysilicon gate structure components of said silicon nitride capped polysilicon gate structures;

depositing a cobalt layer;

performing an anneal cycle to form a cobalt silicide layer on top surfaces of said polysilicon gate structure components, on the top surfaces of said bit line contact structure, and on the top surface of said capacitor structure, while regions of said cobalt layer located on said BPSG spacers, remain unreacted;

removing regions of unreacted cobalt layer;

depositing a silicon oxynitride layer;

depositing a second BPSG layer;

performing a second CMP procedure to planarize said second BPSG layer;

performing a third dry etch procedure to open a first contact hole in said second BPSG layer, and in said silicon oxynitride layer to expose a first region of said cobalt silicide layer located overlying said bit line contact structure, and to open a second contact hole in said second BPSG layer and in said silicon oxynitride layer to expose a second region of said cobalt silicide layer located overlying a polysilicon gate structure component; and forming a first tungsten plug structure in said first contact hole, and forming a second tungsten plug structure in said second contact hole.

13. A method of claim 12, wherein said polysilicon gate structure components, of said silicon nitride capped gate polysilicon structures, are comprised of a polysilicon layer, obtained via LPCVD procedures at a thickness between about 1000 to 3000 Angstroms, and doped in situ during deposition via the addition of arsine, or phosphine, to a silane ambient.

14. The method of claim 12, wherein said first BPSG layer, is obtained via PECVD procedures to a thickness between about 5000 to 10000 Angstroms.

15. The method of claim 12, wherein said first dry etch procedure used to define said tapered capacitor opening and said tapered bit line contact opening, in said first BPSG layer, in said silicon nitride layer and in said silicon oxide layer, is performed via a RIE procedure, using $CHF_3$, at a pressure between about 30 to 60 mtorr, as an etchant for said first BPSG layer, using $Cl_2$ as an etchant for said silicon nitride, and using $CHF_3$ as an etchant for said silicon oxide, at a pressure between about 40 to 60 mtorr.

16. The method of claim 12, wherein said first cycle of said second dry etch procedure, is an anisotropic RIE procedure, employed to selectively remove said first BPSG layer, and to form said BPSG spacers of the sides of said capacitor and bit line contact, is performed using $CHF_3$ as an etchant.

17. The method of claim 12, wherein said second cycle of said second dry etch procedure, used to expose said polysilicon gate structure components of said silicon nitride capped polysilicon gate structures, is an anisotropic RIE procedure, performed using $CF_4$ or $Cl_2$ as an etchant for all silicon nitride layers, and using $CHF_3$ as an etchant for all silicon oxide layers.

18. The method of claim 12, wherein said cobalt layer is obtained via plasma vapor deposition procedures at a thickness between about 100 to 300 Angstroms.

19. The method of claim 12, wherein said anneal procedures, used to form said cobalt silicide layer, is performed at a temperature between about 500 to 800° C., for a time between about 30 to 60 sec.

20. The method of claim 12, wherein said silicon oxynitride layer is obtained via LPCVD Or PECVD procedures at a thickness between about 200 to 500 Angstroms.

21. The method of claim 12, wherein said second BPSG layer, is obtained via PECVD procedures to a thickness between about 5000 to 15000 Angstroms.

22. The method of claim 12, wherein said first tungsten plug structure, and said second tungsten plug structure, are defined via a CMP procedure applied to a tungsten layer which in turn was obtained from via LPCVD procedures at a thickness between about 2000 to 6000 Angstroms.

* * * * *